United States Patent
Yoshida et al.

(10) Patent No.: US 9,070,606 B2
(45) Date of Patent: Jun. 30, 2015

(54) TERMINAL STRUCTURE AND SEMICONDUCTOR DEVICE

(71) Applicant: TDK CORPORATION, Tokyo (JP)

(72) Inventors: Kenichi Yoshida, Tokyo (JP); Makoto Orikasa, Tokyo (JP); Hideyuki Seike, Tokyo (JP); Yuhei Horikawa, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 13/960,228

(22) Filed: Aug. 6, 2013

(65) Prior Publication Data

US 2014/0054768 A1    Feb. 27, 2014

(30) Foreign Application Priority Data

Aug. 24, 2012   (JP) .................. 2012-185042

(51) Int. Cl.
*H01L 23/485* (2006.01)
*H01L 23/492* (2006.01)
*H01L 23/00* (2006.01)

(52) U.S. Cl.
CPC ....... *H01L 24/13* (2013.01); *H01L 2224/13005* (2013.01); *H01L 24/03* (2013.01);
(Continued)

(58) Field of Classification Search
CPC ........... H01L 2224/13111; H01L 2224/13155; H01L 2224/73204; H01L 2224/0401; H01L 24/05; H01L 24/16; H01L 24/13; H01L 24/12; H01L 2225/06513; H01L 2224/81193; H01L 2224/13022; H01L 2224/73203

USPC .......... 257/737, 781, 738, 753, 780, E23.021, 257/E23.026

See application file for complete search history.

(56) References Cited

U.S. PATENT DOCUMENTS

| | | | |
|---|---|---|---|
| 4,205,099 A | 5/1980 | Jones et al. | |
| 5,757,078 A | 5/1998 | Matsuda et al. | |

(Continued)

FOREIGN PATENT DOCUMENTS

| | | |
|---|---|---|
| EP | 2 629 323 A1 | 8/2013 |
| JP | H09-129647 A | 5/1997 |

(Continued)

OTHER PUBLICATIONS

U.S. Appl. No. 13/960,173 in the name of Kenichi Yoshida et al., filed on Aug. 6, 2013.

(Continued)

*Primary Examiner* — Victor A Mandala
(74) *Attorney, Agent, or Firm* — Oliff PLC

(57) ABSTRACT

The present invention relates to a terminal structure comprising: a base material 10; an external electrode 20 formed on the base material; an insulating coating layer 30 formed on the base material and on the electrode and having an opening exposing at least part of the electrode; an under-bump metal layer 70 filling the opening and covering part of the insulating coating layer; and a dome-shaped bump 85 covering the under-bump metal layer, wherein in a cross section along a lamination direction, a height $H_{bm}$ at which the bump has a maximum diameter ($L_{bm}$) is lower than a maximum height $H_u$ of the under-bump metal layer.

6 Claims, 3 Drawing Sheets

(52) U.S. Cl.
CPC ............... *H01L 24/05* (2013.01); *H01L 24/11* (2013.01); *H01L 2224/0345* (2013.01); *H01L 2224/03462* (2013.01); *H01L 2224/03464* (2013.01); *H01L 2224/0347* (2013.01); *H01L 2224/05022* (2013.01); *H01L 2224/05655* (2013.01); *H01L 2224/11464* (2013.01); *H01L 2224/1147* (2013.01); *H01L 2224/11849* (2013.01); *H01L 2224/13023* (2013.01); *H01L 2224/13111* (2013.01); *H01L 2224/13006* (2013.01); *H01L 2224/05572* (2013.01); *H01L 2924/00014* (2013.01); *H01L 2224/0401* (2013.01)

(56) References Cited

U.S. PATENT DOCUMENTS

| | | | |
|---|---|---|---|
| 6,348,399 | B1 | 2/2002 | Lin |
| 6,417,089 | B1 * | 7/2002 | Kim et al. ............ 438/612 |
| 6,538,323 | B1 | 3/2003 | Sakata et al. |
| 6,969,915 | B2 | 11/2005 | Tago et al. |
| 7,282,432 | B2 | 10/2007 | Tago et al. |
| 7,611,041 | B2 | 11/2009 | Tago et al. |
| 7,793,818 | B2 | 9/2010 | Tago et al. |
| 8,643,180 | B2 | 2/2014 | Shinkai et al. |
| 2002/0185733 | A1 | 12/2002 | Chow et al. |
| 2003/0157792 | A1 | 8/2003 | Tong et al. |
| 2007/0249155 | A1 | 10/2007 | Chen et al. |
| 2008/0150134 | A1 | 6/2008 | Shinkai et al. |
| 2008/0257595 | A1 | 10/2008 | Hu |
| 2009/0174052 | A1 | 7/2009 | Sogawa et al. |
| 2010/0200271 | A1 | 8/2010 | Arvin et al. |
| 2011/0316119 | A1 * | 12/2011 | Kim et al. ............ 257/532 |
| 2013/0105971 | A1 * | 5/2013 | Daubenspeck et al. ....... 257/737 |
| 2014/0054769 | A1 * | 2/2014 | Yoshida et al. ............ 257/737 |
| 2014/0175642 | A1 * | 6/2014 | Choi et al. ............ 257/737 |

FOREIGN PATENT DOCUMENTS

| | | | |
|---|---|---|---|
| JP | A-2001-085456 | | 3/2001 |
| JP | A-2002-203868 | | 7/2002 |
| JP | A-2002-299366 | | 10/2002 |
| JP | 2006-093290 | * | 9/2004 .......... 21/60 |
| JP | A-2006-93290 | | 4/2006 |
| JP | 2008-159949 A | | 7/2008 |
| KR | 2002 0061528 | | 7/2002 |

OTHER PUBLICATIONS

U.S. Appl. No. 13/960,291 in the name of Kenichi Yoshida et al., filed on Aug. 6, 2013.
U.S. Appl. No. 13/960,330 in the name of Kenichi Yoshida et al., filed on Aug. 6, 2013.
Jan. 9, 2015 Office Action issued in U.S. Appl. No. 13/960,330.
Mar. 4, 2015 Office Action cited in U.S. Appl. No. 13/960,173.

* cited by examiner (a)

(b)

(c)

(d)

(a)

(b)

(c)

(d)

(a)

(b)

(c)

(d)

TERMINAL STRUCTURE AND SEMICONDUCTOR DEVICE

BACKGROUND OF THE INVENTION

1. Field of the Invention

The present invention relates to a terminal structure and a semiconductor device.

2. Related Background Art

For high-density packaging of high performance semiconductors such as central processing unit (CPU), a transition is underway from a wire bonding mounting method as a general-purpose technique to a flip-chip mounting method of forming a bump made of solder or the like on a chip electrode and directly bonding the bump to a substrate.

For example, Patent Literature 1 (Japanese Patent Laid-Open No. 2001-085456) and Patent Literature 2 (Japanese Patent Laid-Open No. 2002-203868) disclose methods of forming a bump on electrodes provided on a base material.

SUMMARY OF TUE INVENTION

With the miniaturization of semiconductor devices, it is needed to arrange bumps more closely to each other, that is, bump pitch reduction. Unfortunately, the use of the aforementioned conventional bumps cannot sufficiently meet the need for bump pitch reduction due to the shape as described below.

FIG. 1 is a schematic view illustrating a conventional bump forming process. First, as illustrated in FIG. 1(a), a substrate including an external electrode 20 on a base material 10, a passivation layer (insulating coating layer) 30, and a seed layer 40 are provided. Then, a dry film 100 is formed so as to cover part of the seed layer, and electroplating is performed, which includes electrolytic nickel plating and electrolytic solder plating in this order, to thereby form a under-bump metal layer 50 and a solder plating layer 60 (FIG. 1(b)). Then, the dry film is stripped and an unnecessary seed layer is removed by etching (FIG. 1(c)). Subsequently, the entire substrate is placed in a reflow furnace and heated to thereby form a bump 65 (FIG. 1(d)). As illustrated in FIG. 1(d), thus formed bump 65 has a mushroom shape having a tapered base in a cross section along a lamination direction so as to have a maximum diameter $L_{bm}$ at a height farther from the external electrode 20. When an attempt is made to arrange bumps close to each other, such a bump shape may cause bumps to expand beyond the passivation layer to contact to each other, leading to shorting, which limits the potential bump pitch reduction by reducing an inter-bump spacing $P_b$.

In addition, since the bump is formed so as to expand beyond an end portion of the under-bump metal layer, fillings such as a filler and a resin may not be sufficiently wrapped around a bump base portion at mounting. The use of conventional bumps involves a problem in that there is a need to maintain some degree of inter-bump spacing $P_b$ in order to ensure a better wrapping-around of these fillings.

In view of the above problems, an object of the present invention is to provide a terminal structure capable of sufficiently meeting the need for bump pitch reduction.

The present invention provides a terminal structure comprising: a base material; an electrode formed on the base material; an insulating coating layer formed on the base material and on the electrode and having an opening exposing at least part of the electrode; an under-bump metal layer filling the opening and covering part of the insulating coating layer; and a dome-shaped bump covering the under-bump metal layer, wherein in a cross section along a lamination direction, a height at which the bump has a maximum diameter is lower than a maximum height of the under-bump metal layer.

Any terminal structure having such a configuration does not have a bump shape having a maximum diameter $L_{bm}$ at a height farther from the electrode and thus does not cause the bumps to short to each other in the portion. Thus, the terminal structure can sufficiently meet the need for bump pitch reduction. Since the bumps are not expand beyond the end portion of the under-bump metal layer, even the reduction in inter-bump spacing allows the fillings such as a filler and a resin to be easily wrapped around the bump base portion at mounting.

Also, in the present invention, the bump preferably has a maximum diameter of 5 to 40 µm. This makes it possible to more suppress a risk of shorting of bumps to each other even if the bump pitch is reduced.

Also, in the present invention, the bump preferably contains tin (Sn) as a main component. This causes the bump to have a suitable dome shape, leading to that the height at which the bump has a maximum diameter can be easily located lower than the maximum height of the under-bump metal layer. As used herein, "contains tin as a main component" means that the content of tin is 90 mass % or more of the entire constituent component.

Also, in the present invention, the under-bump metal layer preferably contains nickel (Ni) as a main component. This makes it possible to suitably suppress the metal contained in the bump from diffusing into the external electrode. As used herein, "contains nickel as a main component" means that the content of nickel is 85 mass % or more of the entire constituent component.

Further, in the present invention, the bump preferably contains titanium (Ti). This makes it possible to suitably suppress the metal contained in the bump from diffusing into the under-bump metal layer.

The present invention provides a semiconductor device having the terminal structure according to the present invention as described above. Any semiconductor device having the terminal structure according to the present invention can meet the need for miniaturization of semiconductor devices.

The present invention can provide a terminal structure capable of sufficiently meeting the need for bump pitch reduction.

DESCRIPTION OF THE PREFERRED EMBODIMENTS

Figure 1:
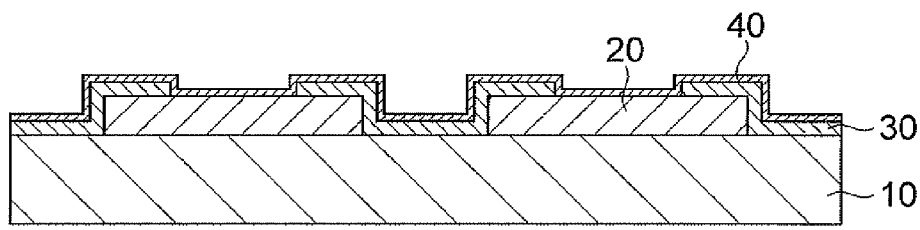
FIGS. 1(a)-(d) are schematic views illustrating a conventional bump forming process.
Figure 1:
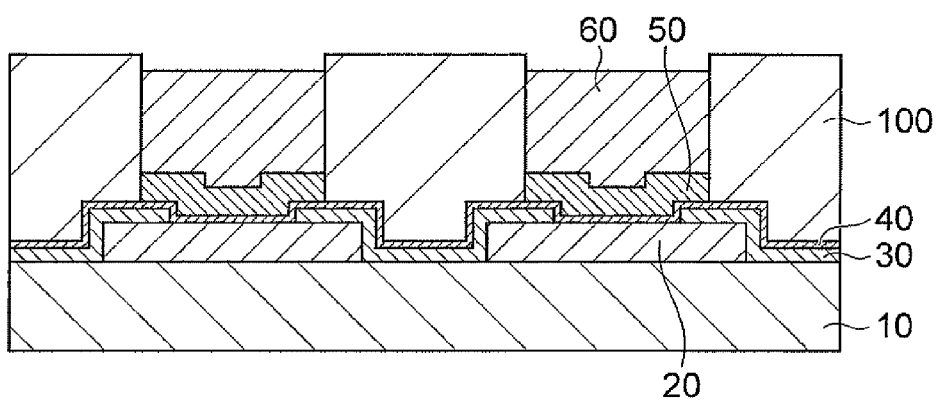
Figure 1:
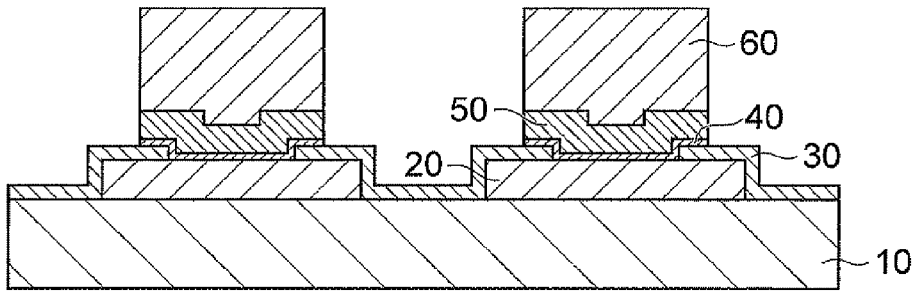
Figure 1:
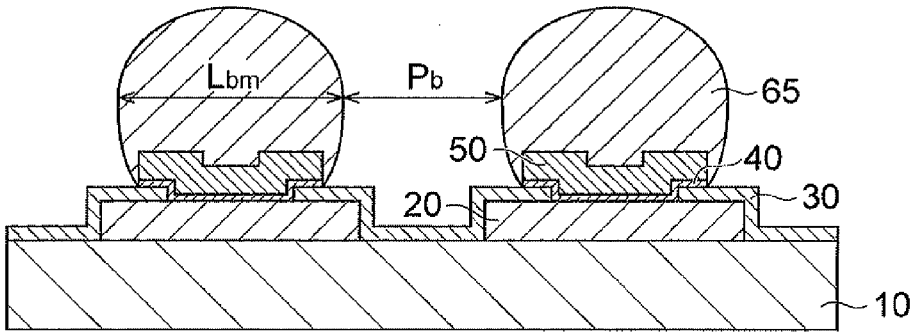

There follows a description of preferred embodiments of the present invention, referring to the accompanying drawings as needed. Note that in the following drawings, the same reference numerals or characters are assigned to the same or similar components and the duplicate description is omitted.

[Terminal Structure Forming Process]

Figure 2:
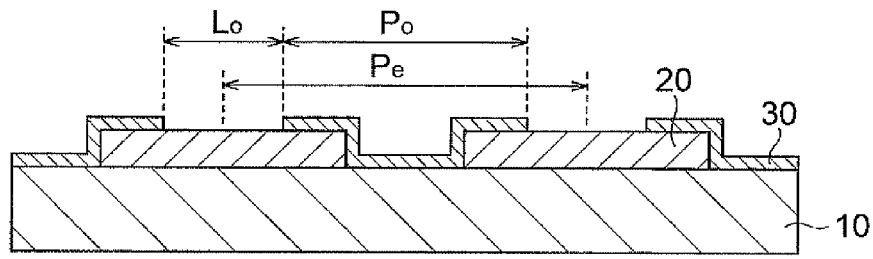
FIGS. 2(a)-(d) are sectional views schematically illustrating a preferred process of forming a terminal structure according to the present embodiment.
Figure 2:
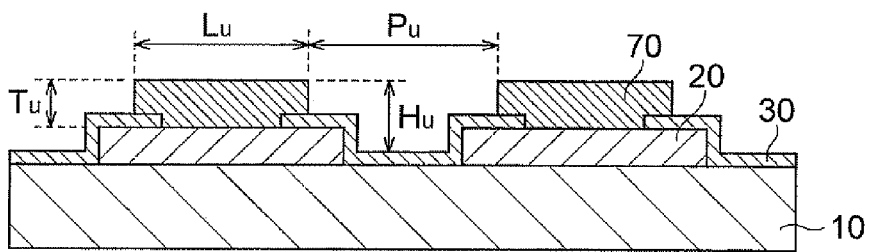
Figure 2:
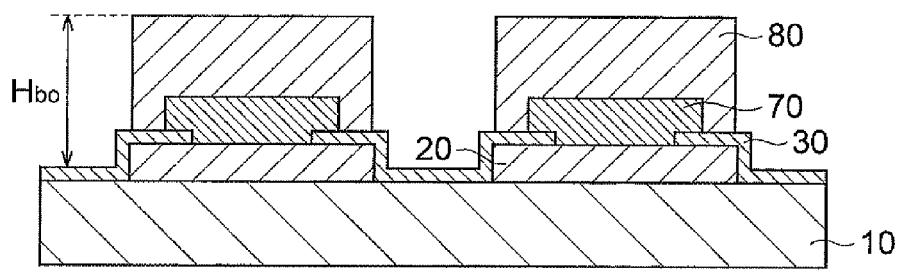
Figure 2:
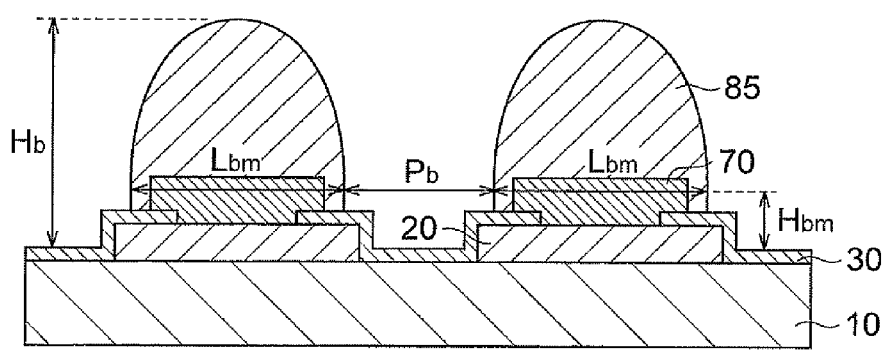

FIG. 2 is a sectional view schematically illustrating a preferred process of forming a terminal structure according to the present embodiment. First, as illustrated in FIG. 2(a), a well-known method is used to individually form an external electrode 20 on a base material 10 and an insulating coating layer 30 having an opening on the external electrode. Note that the thickness of the external electrode, pitch $P_e$ (arrangement spacing) of the external electrode, and the thickness of the insulating coating layer are not particularly limited, but are preferably 1 to 30 µm, 10 to 150 µm, and 0.1 to 50 µm respectively for achieving a balance between ease of implementation for forming these layers and bump pitch reduction. Meanwhile, diameter $L_o$ of the opening and spacing $P_o$ of the adjacent openings are preferably 3 to 30 µm and 5 to 120 µm respectively from the point of view of improving the electrical connectivity between the external electrode and the bump as well as the electrical insulation between adjacent bumps. Note that examples of the base material include a silicon substrate, an organic substrate, and the like; and examples of the external electrode include an electrode made of Cu, Cu alloy, Al, Al alloy, and the like as the respective preferred aspects thereof. In addition, the insulating coating layer is not particularly limited as long as the layer can protect the base material surface and the external electrode surface from corrosion due to moisture or the like, but examples thereof include a layer made of polyimide, SiN, or the like.

Note that the planar shape (shape of the terminal structure as viewed from above) of the opening in the insulating coating layer 30 is not particularly limited, but may include various shapes such as a circle and a polygon. The description of the present embodiment assumes that, though not illustrated, the opening, an under-bump metal layer (UBM layer) 70, and a bump 85 to be described later have a circular planar shape. Note that when the planar shape of the opening is a polygon, the diameter of the opening and the like may be, for example, a maximum length of a line of intersection between a plane of the polygon and a plane perpendicular to the plane of the polygon including a line passing through substantially the center of the polygon.

Then, as illustrated in FIG. 2(*b*), a well-known pretreatment is performed on the external electrode surface exposed in an opening of the insulating coating layer and then electroless nickel plating is performed to fill the opening thereof to thereby form a UBM layer 70 covering part of the insulating coating layer. Note that, when the external electrode is made of Cu or Cu alloy, examples of the aforementioned pretreatment include degreasing, pickling, and activating treatments. Note also that, when the external electrode is made of Al or Al alloy, examples of the aforementioned pretreatment include degreasing, pickling, and zincate treatments.

From the point of view of preventing the metal contained in the bump from reaching the external electrode due to diffusion or the like, a maximum thickness $T_u$ of the UBM layer is preferably 0.5 to 10 µm on the basis of the external electrode surface. Note that from the point of view of providing a good filling property such as a filler and a resin at mounting, a maximum height $H_u$ of the UBM layer is preferably 3 to 15 µm on the basis of the surface of the insulating coating layer on the base material. Note also that from the point of view of providing a good adhesion property between the bump and the UBM layer, a maximum diameter $L_u$ of the UBM layer is preferably 4 to 35 µm. Note further that from the point of view of providing good electrical insulation between adjacent bumps, a spacing $P_u$ of the adjacent UBM layers is preferably 4 to 115 µm.

Then, as illustrated in FIG. 2(*c*), reduction-type electroless tin plating is performed to form a tin plating layer 80 covering the UBM layer and part of the insulating coating layer so as to enclose the entire UBM layer. This makes it possible to obtain a precursor substrate to obtain a desired terminal structure. At this time, from the point of view of obtaining a sufficient amount of bump metal for implementation, a maximum height $H_{b0}$ of the tin plating layer is preferably 5 to 40 µm on the basis of the surface of the insulating coating layer on the base material.

Further, the precursor substrate obtained in FIG. 2(*c*) is subjected to a high-temperature process (reflow) in a nitrogen atmosphere to melt the tin plating layer 80, which is further subjected to rapid cooling to be solidified to thereby form a dome-shaped tin bump 85 (FIG. 2(*d*)). The reflow conditions are not particularly limited, but preferably the oxygen concentration in the atmosphere is 1000 ppm or less, the temperature is 235 to 300° C., and the holding time is 5 to 120 seconds. Note that this high-temperature process may cause an intermetallic compound consisting mainly of tin (50 mass % or more) to be formed in a boundary portion between the tin bump and the UBM layer, and the intermetallic compound consisting mainly of tin is also assumed to be part of the tin bump.

At this time, from the point of view of ensuring sufficient and appropriate contact with a connection terminal for implementation, the maximum height $H_b$ of the tin bump is preferably 5 to 50 µm on the basis of the surface of the insulating coating layer on the base material. Note that from the point of view of providing good electrical insulation between adjacent bumps, an inter-bump spacing $P_b$ of the adjacent tin bumps is preferably 3 to 110 µm. Note further that from the point of view of providing good electrical insulation between the adjacent bumps and a good filling property such as a filler and a resin at mounting, the height $H_{bm}$ at which the bump has a maximum diameter is preferably 2 to 10 µm on the basis of the surface of the insulating coating layer on the base material in a range not exceeding the maximum height $H_u$ of the UBM layer. Note also that from the point of view of reducing a risk of shorting of bumps to each other and ensuring bump strength, the maximum bump diameter (maximum value of the bump diameter) $L_{bm}$ is preferably 5 to 40 µm. Note that in the present embodiment, the maximum bump diameter is located at a height including the UBM layer inside the tin bump as illustrated in FIG. 2(*d*).

These heights and the like can be measured by observing the cross section along a lamination direction of the terminal structure, for example, by means of a scanning electron microscope (SEM) or the like.

Thus, as illustrated in FIG. 2(*d*), there can be manufactured a terminal structure comprising the base material 10; the external electrode 20 formed on the base material; the insulating coating layer 30 formed on the base material and on the external electrode and having an opening exposing at least part of the external electrode; the UBM layer 70 filling the opening and covering part of the insulating coating layer; and a dome-shaped bump 85 covering the UBM layer and part of the insulating coating layer, wherein the height $H_{bm}$ at which the bump has a maximum diameter ($L_{bm}$) in a cross section along a lamination direction is less than the maximum height $H_u$ of the UBM layer.

The present inventors consider that such a terminal structure can be implemented by obtaining a precursor substrate by reduction-type electroless tin plating. Specifically, the precursor substrate for obtaining the terminal structure of the present embodiment is such that as illustrated in FIG. 2(*c*), a reduction-type electroless tin plating layer is formed so as to completely cover the UBM layer. Thus, when the tin plating layer is melted by a high-temperature process, the tin plating layer in a melted state is deformed by surface tension so as to move upward (in a direction opposite to the UBM layer), which is subsequently subjected to rapid cooling to be solidified to thereby maintain the shape. Specifically, the terminal structure is such that the bump has a maximum diameter downward from the maximum height of the UBM layer. Meanwhile, in the precursor substrate obtained by the conventional technique, as illustrated in FIG. 1(c), the dry film is formed and then electroplating is performed, which causes an electrolytic solder plating layer to contact only an upper surface of the UBM layer, resulting in that the end surface of the UBM layer is in an exposed state. Thus, when the solder plating layer is melted by a high-temperature process, the solder plating layer in a melted state is deformed by surface tension so as to move upward and at the same time is deformed so as to move downward outward so as to wrap around the exposed end surface of the UBM layer (that is, so as not to allow the solder plating layer to cover up to the insulating coating layer). As a result, the solder plating layer is deformed so as to swell isotropically as a whole, and is subsequently subjected to rapid cooling to be solidified to thereby maintain the shape. Specifically, the terminal structure is such that the bump has a maximum diameter substantially near the center of the maximum height thereof and the height at which the bump has the maximum diameter is greater than the maximum height of the UBM layer. Thus, the conventional technique cannot obtain such a terminal structure as in the present embodiment. Further, during the high-temperature process, the solder plating layer in a melted state is deformed so as to swell isotropically, which tends to increase a risk of shorting adjacent bumps to each other.

Note that in the present embodiment, a ratio between $H_{bm}$ and $H_u$ ($H_{bm}/H_u$) is not particularly limited as long as $H_{bm}$ is lower than $H_u$, but from the point of view of providing a good adhesion property between the tin bump and the UBM layer as well as a good filling property such as a filler and a resin at mounting, the ratio $H_{bm}/H_u$ is preferably equal to or less than 0.95 and more preferably equal to or less than 0.90. Note also that depending on the thickness and the like of other configurations, in view of the terminal structure design, the ratio $H_{bm}/H_u$ is preferably equal to or greater than 0.10.

Note that in FIG. 2(b), the UBM layer is formed by electroless nickel plating, but the UBM layer may be formed by electrolytic nickel plating.

Specifically, first, as illustrated in FIG. 3(a), in the same manner as described above in FIG. 2(a), a well-known method is used to individually form an external electrode 20 on a base material 10 and an insulating coating layer 30 having an opening on the external electrode.

Then, as illustrated in FIG. 3(b), a well-known method such as sputtering is used to form a seed layer 40 on the external electrode surface exposed in the insulating coating layer opening and the insulating coating layer surface. Subsequently, a dry film 100 is formed and a well-known technique such as photoresist is used to pattern the dry film to thereby remove the dry film around the insulating coating layer opening. Then, electrolytic nickel plating is performed on the external electrode surface exposed in the insulating coating layer opening and part of the insulating coating layer surface (seed layer surface not covered with the dry film) to form a UBM layer 50. Note that the seed layer is not particularly limited as long as electroplating can be performed, but for example, may preferably be about 0.1 μm thick copper layer.

Further, as illustrated in FIG. 3(c), the dry film 100 is stripped and the unnecessary seed layer 40 is removed by a well-known technique. Then, in the same manner as described above in FIG. 2(c), reduction-type electroless tin plating is performed to form a tin plating layer 80. This makes it possible to obtain a precursor substrate for obtaining a desired terminal structure. Note that as illustrated in FIG. 3(c), the maximum thickness $T_u$ of the UBM layer is a thickness from the upper surface of the external electrode. Note also that the maximum height $H_u$ of the UBM layer is a height of the convex portion located in an end portion of the UBM layer from the upper surface of the insulating coating layer on the external electrode.

Subsequently, in the same manner as described above, the precursor substrate is subjected to a high-temperature process (reflow), which can obtain a terminal structure as illustrated in FIG. 3(d).

[Electroless Nickel Plating]

A plating solution containing a nickel salt, a complexing agent, a reducing agent, and the like can be used for electroless nickel plating. From the point of view of providing good workability (bath stability and deposition rate) for electroless nickel plating, a plating solution containing a hypophosphorous acid as the reducing agent is preferably used.

Note that the UBM layer formed by electroless nickel plating contains Ni as a main component, but preferably contains Ni and P as constituent elements. From the point of view of obtaining flexibility and low stress of the UBM layer, the UBM layer more preferably contains 5 to 15 mass % of P. Note also that the UBM layer may contain not only Ni and P but also S or the like.

[Electrolytic Nickel Plating]

For example, a well-known Watts bath or sulfamate bath can be used as the electrolytic nickel plating. From the point of view of obtaining flexibility and low stress of the nickel plating film, the sulfamate bath may preferably be used.

Note also that the UBM layer formed by electrolytic nickel plating may consist of only Ni as a constituent element, but may contain not only Ni but also S, P, and the like.

[Reduction-Type Electroless Tin Plating]

A plating solution containing a tin compound, an organic complexing agent, and an organic sulfur compound, an antioxidant, and a trivalent titanium compound as a reducing agent is preferably used for reduction-type electroless tin plating. Tin can be stably deposited on the UBM layer by appropriately selecting the kind and concentration of these constituent components. There follows a detailed description, but the kind, concentration, and mechanism thereof are not limited to the description.

The tin compound is not particularly limited as long as it serves as a source of tin, but is preferably one or two or more kinds selected from the group consisting of an inorganic acid salt of tin, a carboxylic acid salt of tin, an alkane sulfonic acid salt of tin, an alkanol sulfonic acid salt of tin, and a hydroxide of tin, as well as metastannic acid. These water-soluble tin compounds can be used as a mixture of one or two or more kinds thereof.

Note that valence (oxidation number) of tin as the tin compound may be either divalent or tetravalent, but is preferably divalent from the point of view of having a good deposition rate. That is, the stannous compound is preferred.

The content of the tin compound in the reduction-type electroless tin plating solution is not particularly limited, but is preferably 0.5 g/L to 100 g/L, more preferably 5 g/L to 30 g/L, and further more preferably 7 g/L to 15 g/L as metallic tin for the entire reduction-type electroless tin plating solution. If the content of the metallic tin in the reduction-type electroless tin plating solution is equal to or greater than 0.5 g/L, the deposition rate of tin coating can be sped up at a practical level. If the content of the metallic tin in the reduction-type electroless tin plating solution is equal to or less than 100 g/L, the tin compound as a tin source can be easily dissolved.

Although not particularly limited as the organic complexing agent, a phosphonic acid compound containing a trivalent phosphorus with an oxidation number of 3 like an organic phosphonic acid compound is preferred, examples thereof including amino group-containing methylene phosphonic acids such as nitrilo trimethylene phosphonic acid, ethylene diamine tetra methylene phosphonic acid, diethylenetriamine pentamethylene phosphonic acid, hexamethylene diamine tetra methylene phosphonic acid, and hexamethylene triamine penta methylene phosphonic acid; hydroxyl group-containing phosphonic acids such as 1-hydroxyethylidene-1,1-diphosphonic acid; benzene phosphonic acids such as 3-methoxy benzene phosphonic acid; benzyl phosphonic acids such as 3-methyl benzyl phosphonic acid and 4-cyanobenzyl phosphonic acid; alkali metal salts thereof; alkaline earth metal salts thereof; and ammonium salts thereof. Among them, the hydroxyl group-containing phosphonic acids are more preferable. The organic complexing agent can be used as a mixture of one or two or more kinds of these compounds.

The content of the organic complexing agent in the reduction-type electroless tin plating solution is not particularly limited, but is preferably 1 g/L to 500 g/L, more preferably 10 g/L to 200 g/L, and further more preferably 50 g/L to 150 g/L for the entire reduction-type electroless tin plating solution. If the content of the organic complexing agent in the reduction-type electroless tin plating solution is equal to or greater than 1 g/L, the organic complexing agent has a sufficient complexation force, stabilizes the plating solution, and can sufficiently exert an effect as the complexing agent; and if the content is equal to or less than 500 g/L, the organic complexing agent is readily soluble in water. Note that there is no further increase in the effect as the complexing agent with a content of 500 g/L or more, which may be uneconomical in terms of cost.

The organic sulfur compound is preferably an organic sulfur compound selected from the group consisting of mercaptans and sulfides. The "mercaptans" refer to a compound having a mercapto group (—SH) in the molecule. The "sulfides" refer to a compound having a sulfide group (—S—) in the molecule, and examples of the group attached to S include an alkanoyl group such as an alkyl group, an aryl group, and an acetyl group (ethanoyl group). Also, the sulfides include a polysulfide having a plurality of "—S—" directly bonded such as a disulfide and a trisulfide. Note that both mercaptans and sulfides, in which lone pair on S atom is active, act as a catalyst for tin deposition on the UBM layer (on the Ni film), and thus can stably deposit tin on the UBM layer.

The content of the organic sulfur compound in the reduction-type electroless tin plating solution is not particularly limited, but is preferably 0.1 ppm to 100000 ppm, more preferably 1 ppm to 10000 ppm, and further more preferably 5 ppm to 1000 ppm for the entire reduction-type electroless tin plating solution. If the content of the organic sulfur compound in the reduction-type electroless tin plating solution is equal to or greater than 0.1 ppm, a sufficient deposition rate can be secured. Meanwhile, if the content is equal to or less than 100000 ppm, the organic sulfur compound is readily soluble in water, and thus a stable plating solution can be obtained.

The antioxidant is not particularly limited as long as the antioxidant can prevent the oxidation of tin with a valence (oxidation number) of two to tin with a valence of four, but specific examples thereof include a phosphoric acid containing compound (hypophosphorous acid compound and phosphorous acid compound), hydrazine derivative, catechol, hydroquinone, pyrogallol, and salts thereof. Among them, the phosphoric acid containing compound is preferable and the phosphorous acid compound is more preferable. These antioxidants can be used as a mixture of one or two or more kinds thereof. Note that the addition of the antioxidant can not only prevent the aforementioned tin oxidation but also suppress excessive oxidation of trivalent titanium to be described later. This makes it possible to obtain a more stable plating solution and stably deposit tin onto the UBM layer (on the Ni film).

The content of the antioxidant in the reduction-type electroless tin plating solution is not particularly limited, but is preferably 0.1 g/L to 100 g/L and more preferably 1 g/L to 80 g/L for the entire reduction-type electroless tin plating solution. If the content of the antioxidant in the reduction-type electroless tin plating solution is equal to or greater than 0.1 g/L, the effect of the antioxidant can be sufficiently secured; and if the content is equal to or less than 100 g/L, abnormal deposition of tin in the reduction-type electroless tin plating solution can be suppressed, leading to good bath stability and stable tin plating.

The titanium compound is not particularly limited as long as the titanium compound is water-soluble and acts as a reducing agent, but specifically, for example, from the point of view of plating performance, easy availability, and the like, titanium halide such as titanium trichloride, titanium triiodide, and titanium tribromide; and titanium sulfate are preferable. The titanium is preferable to have a valence (oxidation number) of three. The reason for this is that the divalent titanium compound is unstable and may be readily oxidized and changed into tetravalent; and the tetravalent titanium compound itself is not oxidized and thus may not supply electrons. These water-soluble titanium compounds can be used as a mixture of one or two or more kinds thereof. Among them, from the point of view of plating performance, easy availability, and the like, titanium trichloride is particularly preferred.

The content of the titanium compound in the reduction-type electroless tin plating solution is not particularly limited, but is preferably 0.01 g/L to 100 g/L, more preferably 0.1 g/L to 20 g/L, and further more preferably 1 g/L to 10 g/L, as a titanium metal for the entire reduction-type electroless tin plating solution. If the content of the water-soluble titanium compound in the reduction-type electroless tin plating solution is equal to or greater than 0.01 g/L, the deposition rate of tin coating can be increased to a practical speed; and if the content of the water-soluble titanium compound in the reduction-type electroless tin plating solution is equal to or less than 100 g/L, abnormal deposition of tin can be suppressed, leading to good bath stability and stable tin plating.

Note that the reduction-type electroless tin plating solution may not only contain these components but also, as needed, appropriately contain a buffering agent for maintaining the plating solution at a constant pH, a surface-active agent for removing a pinhole of a tin plating film and providing good foam-breaking performance of the plating solution, or a brightening agent for more smoothing the tin plating coating.

The plating conditions for the reduction-type electroless tin plating solution are not particularly limited, but the temperature condition is preferably 40° C. to 90° C. and more preferably 50° C. to 80° C. Also, the plating time is preferably 30 seconds to 5 hours and more preferably 1 minute to 2 hours.

Note that the tin plating layer (bump) formed by reduction-type electroless tin plating contains Sn as a main component, but preferably contains Sn and Ti as constituent elements. In particular, if the tin plating layer contains Ti, the metal contained in the bump can be suppressed from being diffused into the UBM layer.

[Semiconductor Device]

Thus fabricated terminal structure can be suitably applied to semiconductor devices and the like. For example, if applied to a semiconductor device, a material in which a semiconductor circuit is formed on a surface or an inside of a silicon substrate or the like can be applied as the base material 10. In addition, an electrode electrically connected to the semiconductor circuit can be applied as the external electrode 20. Note that the surface of the silicon substrate or the like may include a trench or a step. In this case, the external electrode 20 may be formed in a portion having the aforementioned trench or step. Specifically, the external electrode 20 may be formed, for example, on a bottom surface (concave portion) of the trench, an upper surface (convex portion) of the step, a bottom surface (concave portion) of the step, or the like. Alternatively, the external electrode 20 may be formed on a surface substantially perpendicular to a main surface of the silicon substrate or the like. Specifically, the external electrode 20 may be formed, for example, on a side surface of the silicon substrate or the like, on a side surface of the trench or the step, or the like. Such a semiconductor device reduces the inter-bump spacing between adjacent bumps, but can easily fill a filler, resin, or the like at mounting even if the inter-bump spacing is reduced, which can sufficiently meet the need for miniaturization of semiconductor devices.

EXAMPLES

There follows a more detailed description of the content of the present invention using examples and comparative examples, but the present invention is not limited to the following examples.

Example 1

(Substrate Preparation)

There was prepared a silicon substrate (5×5 mm, 0.6 mm thick) on which an external electrode and a SiN insulating coating layer having an opening are formed as illustrated in FIG. 2(*a*). Note that the external electrode was made of copper and the 10×10 openings were arranged so as to be equally spaced from each other. In addition, the silicon substrate was prepared such that the external electrode was pre-wired so as to form a daisy circuit at mounting in order to confirm conductivity at a heat cycle test to be described later.

(Electroless Nickel Plating)

Then, predetermined pretreatments (degreasing, pickling, and activating treatments) were performed on a copper external electrode surface exposed in an opening of the SiN insulating coating layer, followed by electroless nickel plating, to form a UBM layer filling the opening and covering part of the SiN insulating coating layer (FIG. 2(*b*)). Note that as the electroless nickel plating, a well-known electroless nickel-phosphorus plating solution (phosphorus concentration of 10 mass % in the UBM layer) was used. In addition, as the plating conditions, the temperature was 85° C., and the time was adjusted so as to obtain a predetermined nickel plating layer thickness.

(Reduction-Type Electroless Tin Plating)

Further, reduction-type electroless tin plating was performed and there was obtained a precursor substrate on which a tin plating layer covering the UBM layer and part of the SiN insulating coating layer was formed so as to enclose the entire UBM layer formed as described above (FIG. 2(*c*)). Note that the compositions of the reduction-type electroless tin plating solution were as follows. In addition, as the plating conditions, the temperature was 60° C. and the time was adjusted so as to obtain a predetermined tin plating layer height.

Tin compound (stannous chloride): 10 g/L (as tin)

Phosphorus-containing organic complexing agent (hydroxyl group-containing phosphonic acid): 100 g/L Organic sulfur compound (sulfide group-containing organic sulfur compound): 100 ppm Antioxidant (phosphorous acid compound): 40 g/L Reducing agent (titanium trichloride): 5 g/L (as titanium)

(Reflow)

Thus obtained precursor substrate was held at 250° C. for 30 seconds in a nitrogen atmosphere (at an oxygen concentration of 500 ppm) to melt the tin plating layer, which was further subjected to rapid cooling to be solidified, and there was obtained a silicon TEG (Test Element Group) substrate comprising a terminal structure having a dome-shaped tin bump as illustrated in FIG. 2(*d*). Note that the thickness, the pitch, and the like of each component were as shown in Table 1.

Examples 2 to 6

In the same manner as in example 1 except that the thickness, the pitch, and the like of each component were changed as shown in Table 1, there was obtained a silicon TEG substrate comprising a terminal structure as illustrated in FIG. 2(*d*).

Example 7

Figure 3:
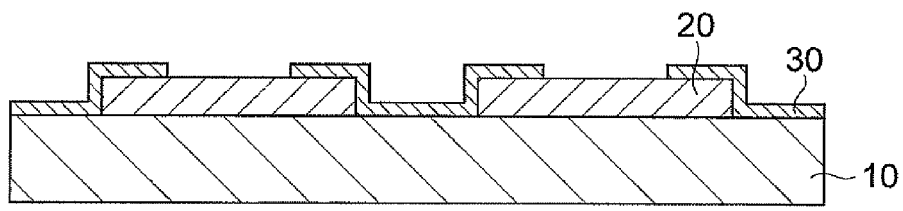
FIGS. 3(a)-(d) are sectional views schematically illustrating a preferred process of forming a terminal structure according to the present embodiment.
Figure 3:
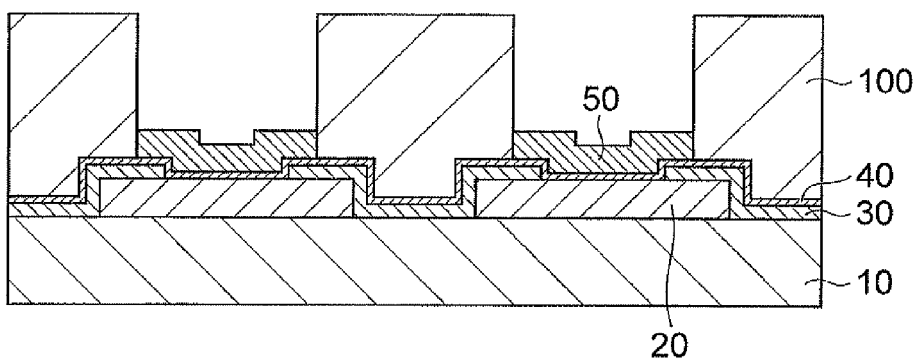
Figure 3:
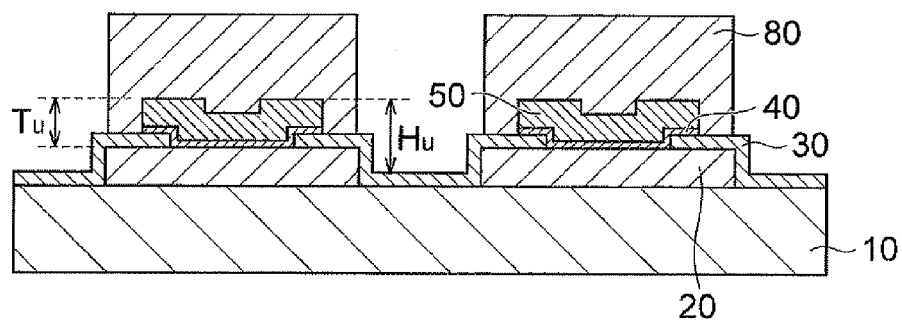
Figure 3:
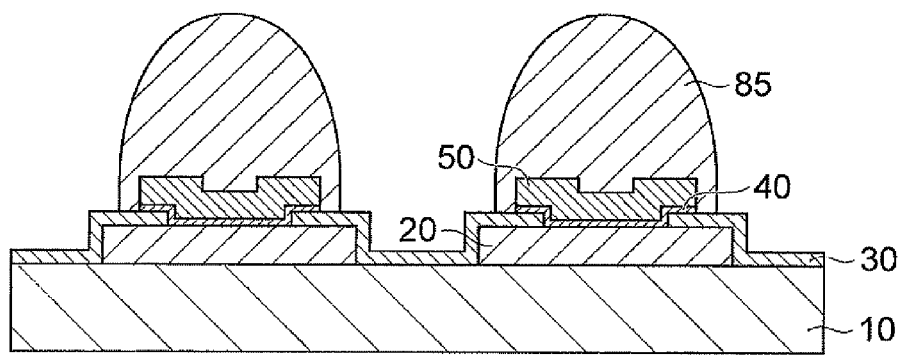

In the same manner as in example 1 except that electrolytic nickel plating was performed instead of electroless nickel plating, there was obtained a silicon TEG substrate comprising a terminal structure as illustrated in FIG. 3(*d*).

The electrolytic nickel plating was performed in the following manner. First, a 0.1 µm thick copper layer was formed as a seed layer by sputtering on the copper external electrode surface exposed in the SiN insulating coating layer opening and the SiN insulating coating layer surface (FIG. 3(*a*)), and then a dry film was formed. Subsequently, the dry film was patterned by photoresist to remove the dry film around the SiN insulating coating layer opening. Then, electrolytic nickel plating was performed on the external electrode surface exposed in the SiN insulating coating layer opening and part of the insulating coating layer surface to form the UBM layer (FIG. 3(*b*)). Then, the dry film was stripped and an unnecessary seed layer was removed to form a tin plating layer (FIG. 3(*c*)). Note that a well-known sulfamate bath was used as the electrolytic nickel plating. Note also that as the plating conditions, the temperature was 50° C., and the time and the plating current value were adjusted so as to obtain a predetermined nickel plating layer thickness.

Example 8

In the same manner as in example 1 except that the external electrode was made of Al-0.5 mass % Cu alloy and predetermined pretreatments (degreasing, pickling, and zincate treatments) were performed on the external electrode surface, a silicon TEG substrate comprising a terminal structure as illustrated in FIG. 2(*d*) was obtained.

Example 9

In the same manner as in example 4 except that the external electrode was made of Al-0.5 mass % Cu alloy and predetermined pretreatments (degreasing, pickling, and zincate treatments) were performed on the external electrode surface, a silicon TEG substrate comprising a terminal structure as illustrated in FIG. 2(d) was obtained.

Note that the thickness, the pitch, and the like of each component were as illustrated in Table 1.

Comparative examples 1 to 3

In the same manner as in example 7 except that electrolytic solder plating was performed instead of reduction-type electroless tin plating, a silicon TEG substrate comprising a terminal structure was obtained. Note that only comparative example 3 failed to form a dry film, and thus failed to fabricate a terminal structure. Thus, the later described evaluation and test were not performed.

Note that the electrolytic solder plating was performed in the following manner. First, as described in example 7, electrolytic nickel plating was performed on the external electrode surface exposed in the SiN insulating coating layer opening and part of the insulating coating layer surface to form a UBM layer. Subsequently, electrolytic solder plating was continuously performed to form a solder plating layer. At this time, the solder plating layer was formed only on the upper surface of the UBM layer, and the solder plating layer was not formed so as to cover part of the SIN insulating coating layer, that is to enclose the entire UBM layer (FIG. 1(c)).

Note that a well-known alkanol sulfonic acid bath (Cu content of 0.5 mass %) was used as the electrolytic solder plating. Note also that as the plating conditions, the temperature was 50° C., and the time and the plating current value were adjusted so as to obtain a predetermined solder plating layer height.

Subsequently, the dry film was stripped and an unnecessary seed layer was removed; and under the same conditions as in example 6, reflow was performed. Thus, there was obtained a terminal structure having such a shape as illustrated in FIG. 1(d).

Note that the thickness, the pitch, and the like of each component were as illustrated in Table 1.

TABLE 1

|  |  | EXAMPLES | | | | | | |
| --- | --- | --- | --- | --- | --- | --- | --- | --- |
|  |  | 1 | 2 | 3 | 4 | 5 | 6 | 7 |
|  |  | EXTERNAL ELECTRODE | | | | | | |
| MATERIAL |  | Cu | Cu | Cu | Cu | Cu | Cu | Cu |
| THICKNESS |  | 2 μm | 2 μm | 2 μm | 2 μm | 2 μm | 2 μm | 2 μm |
| ELECTRODE SPACING | $P_e$ | 100 μm | 40 μm | 40 μm | 40 μm | 30 μm | 20 μm | 100 μm |
|  |  | INSULATING COATING LAYER | | | | | | |
| MATERIAL |  | SiN | SiN | SiN | SiN | SiN | SiN | SiN |
| THICKNESS |  | 1 μm | 1 μm | 1 μm | 1 μm | 1 μm | 1 μm | 1 μm |
| OPENING DIAMETER | $L_o$ | 20 μm | 15 μm | 8 μm | 8 μm | 8 μm | 4 μm | 20 μm |
| OPENING SPACING | $P_o$ | 80 μm | 25 μm | 32 μm | 32 μm | 22 μm | 15 μm | 80 μm |
|  |  | UBM LAYER | | | | | | |
| PLATING METHOD |  | ELECTRO-LESS | ELECTRO-LESS | ELECTRO-LESS | ELECTRO-LESS | ELECTRO-LESS | ELECTRO-LESS | ELECTRO-LYTIC |
| THICKNESS | $T_u$ | 3 μm | 3 μm | 3 μm | 3 μm | 3 μm | 2 μm | 2 μm |
| HEIGHT | $H_u$ | 4 μm | 4 μm | 4 μm | 4 μm | 4 μm | 3 μm | 3 μm |
| UBM DIAMETER | $L_u$ | 24 μm | 19 μm | 12 μm | 12 μm | 12 μm | 9 μm | 26 μm |
| UBM SPACING | $P_u$ | 76 μm | 21 μm | 28 μm | 28 μm | 28 μm | 11 μm | 74 μm |
|  |  | Sn PLATING LAYER | | | | | | |
| PLATING METHOD |  | ELECTRO-LESS | ELECTRO-LESS | ELECTRO-LESS | ELECTRO-LESS | ELECTRO-LESS | ELECTRO-LESS | ELECTRO-LESS |
| HEIGHT | $H_{b0}$ | 30 μm | 8 μm | 8 μm | 12 μm | 6 μm | 5 μm | 30 μm |
|  |  | BUMP | | | | | | |
| HEIGHT | $H_b$ | 50 μm | 22 μm | 22 μm | 31 μm | 17 μm | 10 μm | 50 μm |
| MAXIMUM DIAMETER | $L_{bm}$ | 30 μm | 21 μm | 15 μm | 18 μm | 15 μm | 10 μm | 32 μm |
| BUMP SPACING | $P_{bm}$ | 70 μm | 19 μm | 25 μm | 22 μm | 15 μm | 10 μm | 68 μm |
| HEIGHT AT MAXIMUM DIAMETER | $H_{bm}$ | 3 μm | 3 μm | 3 μm | 3 μm | 3 μm | 2 μm | 3 μm |

|  |  | EXAMPLES | | COMPARATIVE EXAMPLES | | |
| --- | --- | --- | --- | --- | --- | --- |
|  |  | 8 | 9 | 1 | 2 | 3 |
|  |  | EXTERNAL ELECTRODE | | | | |
| MATERIAL |  | Al—0.5Cu | Al—0.5Cu | Cu | Cu | Cu |
| THICKNESS |  | 2 μm | 2 μm | 2 μm | 2 μm | 2 μm |
| ELECTRODE SPACING | $P_e$ | 100 μm | 40 μm | 100 μm | 40 μm | 30 μm |

TABLE 1-continued

| | | INSULATING COATING LAYER | | | | |
|---|---|---|---|---|---|---|
| MATERIAL | | SiN | SiN | SiN | SiN | SiN |
| THICKNESS | | 1 μm | 1 μm | 1 μm | 1 μm | 1 μm |
| OPENING DIAMETER | $L_o$ | 20 μm | 8 μm | 20 μm | 8 μm | 8 μm |
| OPENING SPACING | $P_o$ | 80 μm | 32 μm | 80 μm | 32 μm | 22 μm |
| | | UBM LAYER | | | | |
| PLATING METHOD | | ELECTROLESS | ELECTROLESS | ELECTROLYTIC | ELECTROLYTIC | ELECTROLYTIC |
| THICKNESS | $T_u$ | 3 μm | 3 μm | 3 μm | 3 μm | — |
| HEIGHT | $H_u$ | 4 μm | 4 μm | 4 μm | 4 μm | — |
| UBM DIAMETER | $L_u$ | 24 μm | 12 μm | 26 μm | 14 μm | — |
| UBM SPACING | $P_u$ | 76 μm | 28 μm | 74 μm | 26 μm | — |
| | | Sn PLATING LAYER | | SOLDER PLATING LAYER | | |
| PLATING METHOD | | ELECTROLESS | ELECTROLESS | ELECTROLYTIC | ELECTROLYTIC | — |
| HEIGHT | $H_{bO}$ | 30 μm | 12 μm | 30 μm | 30 μm | — |
| | | BUMP | | | | |
| HEIGHT | $H_b$ | 50 μm | 31 μm | 35 μm | — | — |
| MAXIMUM DIAMETER | $L_{bm}$ | 30 μm | 18 μm | 30 μm | — | — |
| BUMP SPACING | $P_{bm}$ | 70 μm | 22 μm | 70 μm | — | — |
| HEIGHT AT MAXIMUM DIAMETER | $H_{bm}$ | 3 μm | 3 μm | 15 μm | — | — |

(Bump Formation Evaluation)

A bump formation evaluation was performed on the terminal structures obtained in the examples and the comparative examples in the following manner. Specifically, there were prepared a total of 100 (10×10) bumps and an optical microscope was used to confirm whether adjacent bumps were formed independently from each other or not. Evaluation A was that adjacent bumps were formed independently from each other without shorting; and evaluation B was that even at least a pair of adjacent bumps were shorted to each other. The evaluation results were shown in Table 2. Note that shorting was confirmed in comparative example 2 and thus the bumps shown in Table 1 were not measured.

(Heat Cycle Test)

Heat cycle test were performed on the terminal structures obtained in the examples and the comparative examples in the following manner. Specifically, there were fabricated heat cycle test samples by bonding (10×10) bumps of a pair of two silicon TEG substrates forming a daisy circuit face to face by means of a flip-chip mounter. Then, an evaluation was performed by monitoring conductivity of the daisy circuit for each sample while a heat cycle of −40° C. to 120° C. were added by 1000 cycles. Evaluation A was that conductivity was ensured after the heat cycle test (after 1000 cycles); and evaluation B was that the daisy circuit was cut off in the middle. Note that the heat cycle test was not performed for comparative example 2 in which adjacent bumps were shorted to each other. The evaluation results were shown in Table 2.

TABLE 2

| | EXAMPLES | | | | | | | | | COMPARATIVE EXAMPLES | | |
|---|---|---|---|---|---|---|---|---|---|---|---|---|
| | 1 | 2 | 3 | 4 | 5 | 6 | 7 | 8 | 9 | 1 | 2 | 3 |
| BUMP FORMATION EVALUATION | A | A | A | A | A | A | A | A | A | A | B | — |
| HEAT CYCLE TEST | A | A | A | A | A | A | A | A | A | B | — | — |

REFERENCE SIGNS LIST

10 . . . base material; 20 . . . external electrode; 30 . . . coating layer; 40 . . . seed layer; 50, 70 . . . under-bump metal layer; 60 . . . solder plating layer, 80 . . . tin plating layer; 65, 85 . . . bump; 100 . . . dry film.

What is claimed is:

1. A terminal structure comprising:
a base material;
an electrode formed on the base material;
an insulating coating layer formed on the base material and on the electrode and having an opening exposing at least part of the electrode;
an under-bump metal layer filling the opening and covering part of the insulating coating layer; and
a dome-shaped bump covering the under-bump metal layer, wherein in a cross section along a lamination direction, a height at which the bump has a maximum diameter is lower than a maximum height of the under-bump metal layer.

2. The terminal structure according to claim 1, wherein the bump has a maximum diameter of 5 to 40 μm.

3. The terminal structure according to claim 1 wherein the bump contains tin as a main component.

4. The terminal structure according to claim 1, wherein the under-bump metal layer contains nickel as a main component.

5. The terminal structure according to claim 1, wherein the bump contains titanium.

6. A semiconductor device comprising the terminal structure according to claim 1.

* * * * *